United States Patent
Shaeffer et al.

(10) Patent No.: US 9,006,832 B2
(45) Date of Patent: Apr. 14, 2015

(54) HIGH-VOLTAGE MEMS APPARATUS AND METHOD

(75) Inventors: Derek Shaeffer, Redwood City, CA (US); Baris Cagdaser, Sunnyvale, CA (US); Joseph Seeger, Menlo Park, CA (US)

(73) Assignee: Invensense, Inc., San Jose, CA (US)

( * ) Notice: Subject to any disclaimer, the term of this patent is extended or adjusted under 35 U.S.C. 154(b) by 981 days.

(21) Appl. No.: 13/071,374

(22) Filed: Mar. 24, 2011

(65) Prior Publication Data

US 2012/0242400 A1 Sep. 27, 2012

(51) Int. Cl.
*H01L 23/62* (2006.01)
*H01L 21/00* (2006.01)
*H01L 27/092* (2006.01)
*H01L 21/8238* (2006.01)
*B81B 7/00* (2006.01)

(52) U.S. Cl.
CPC ...... *H01L 27/092* (2013.01); *H01L 21/823892* (2013.01); *B81B 7/008* (2013.01); *B81B 2207/015* (2013.01)

(58) Field of Classification Search
CPC ...... H01L 27/092; B32B 27/18; B32B 27/08; B32B 27/12; B32B 3/12; B32B 21/08; B32B 27/36; B32B 2255/26; B32B 2307/746; B32B 2255/00; H01B 3/40; H01B 3/306; H01B 3/30; H02K 15/04; H02K 3/48; H02K 3/34; C09D 7/125
USPC .............................. 257/357; 438/48
See application file for complete search history.

(56) References Cited

U.S. PATENT DOCUMENTS

| | | | |
|---|---|---|---|
| 6,091,594 A | 7/2000 | Williamson et al. | |
| 6,091,657 A | 7/2000 | Chen et al. | |
| 6,804,552 B2 * | 10/2004 | Thompson et al. | 607/2 |
| 6,912,082 B1 | 6/2005 | Lu et al. | |
| 7,176,732 B2 | 2/2007 | Innocent | |
| 7,382,176 B2 | 6/2008 | Ayres et al. | |
| 7,466,189 B2 | 12/2008 | Sohara et al. | |
| 7,548,365 B2 | 6/2009 | Huffman et al. | |
| 7,633,095 B1 * | 12/2009 | Kerr et al. | 257/133 |
| 7,656,221 B2 | 2/2010 | Maejima | |
| 8,004,354 B1 * | 8/2011 | Pu et al. | 330/86 |
| 8,035,148 B2 * | 10/2011 | Goldstein | 257/299 |
| 2006/0099753 A1 | 5/2006 | Chen et al. | |
| 2010/0086146 A1 | 4/2010 | Gong et al. | |
| 2010/0245809 A1 * | 9/2010 | Andreou et al. | 356/222 |
| 2011/0018616 A1 | 1/2011 | Li et al. | |

OTHER PUBLICATIONS

Roberto Pelliconi, et al., "Power Efficient Charge Pump in Deep Submicron Standard CMOS Technology", IEEE Journal of Solid-State Circuits, vol. 38, No. 6, Jun. 2003, pp. 1068-1071.

Akira Umezawa, et al., "A 5-V-Only Operation 0.6-um Flash EEPROM with Row Decoder Scheme in Triple-Well Structure", IEEE Journal of Solid-State Circuits, vol. 27, No. 11, Nov. 1992, pp. 1540-1546.

* cited by examiner

*Primary Examiner* — William D Coleman
(74) *Attorney, Agent, or Firm* — Sawyer Law Group, P.C.

(57) ABSTRACT

A high-voltage MEMS system compatible with low-voltage semiconductor process technology is disclosed. The system comprises a MEMS device coupled to a high-voltage bias generator employing an extended-voltage isolation residing in a semiconductor technology substrate. The system avoids the use of high-voltage transistors so that special high-voltage processing steps are not required of the semiconductor technology, thereby reducing process cost and complexity. MEMS testing capability is addressed with a self-test circuit allowing modulation of the bias voltage and current so that a need for external high-voltage connections and associated electro-static discharge protection circuitry are also avoided.

26 Claims, 10 Drawing Sheets

HIGH-VOLTAGE MEMS APPARATUS AND METHOD

FIELD OF THE INVENTION

The present invention relates generally to MEMS devices and specifically to a method and system for utilizing a MEMS device in a high voltage environment.

BACKGROUND OF THE INVENTION

Microelectromechanical (MEMS) devices are used in a variety of applications including solid-state accelerometers, gyroscopes and pressure sensors. MEMS devices used in these applications often make use of capacitive sensing to determine the displacement of the MEMS structure when it is acted on by various forces. For example, an accelerometer senses the acceleration of the MEMS device along a certain axis of motion. Acceleration causes a displacement of a MEMS proof mass which might be sensed by detecting a change in the capacitance between that proof mass and a fixed electrode. In a pressure sensor, a displacement might be caused by a change in pressure and this change can also be sensed capacitively in some implementations. Gyroscopes make similar use of capacitive sensing elements, in this case to sense displacements related to a rate of rotation of the MEMS device.

When sensing a change in capacitance, a common technique is to place a voltage bias across the capacitor in question so that any capacitance change is indicated by a flow of charge into or out of the capacitor electrodes. This flow of charge may then be amplified and further processed by the sense electronics. A figure of merit of capacitive sensors is the charge sensitivity, which quantifies the amount of charge that flows in response to a known stimulus. It is generally desirable to maximize the charge sensitivity. One very effective means of doing so is to bias the capacitor at a high voltage so that more charge is produced for a given displacement. For this reason, MEMS devices often take advantage of high-voltage biasing.

The use of high-voltage biasing allows for greater sensitivity, which can then be traded for improvements in other system metrics, such as size (cost) and power consumption. However, the use of high-voltage biasing is not without complications. For example, processing high voltages may require the use of special devices and isolation regions that can tolerate high voltage without incurring damage. Such high-voltage devices and isolation regions may not be available in the lowest-cost semiconductor technologies which are typically low-voltage technologies, necessitating the use of more expensive technologies to enable high-voltage biasing and signal processing. The performance gains afforded by the use of high-voltage may therefore be contrary to the goal of cost reduction.

It would therefore be useful to identify techniques for supporting high-voltage biasing in a manner compatible with low-voltage process technologies. The present invention addresses such a need.

SUMMARY OF THE INVENTION

A high-voltage MEMS system compatible with low-voltage semiconductor process technology is disclosed. The system comprises a MEMS device coupled to a high-voltage bias generator employing an extended-voltage isolation residing in a semiconductor technology substrate. The system avoids the use of high-voltage transistors so that special high-voltage processing steps are not required of the semiconductor technology, thereby reducing process cost and complexity. MEMS testing capability is addressed with a self-test circuit allowing modulation of the bias voltage and current so that a need for external high-voltage connections and associated electro-static discharge protection circuitry are also avoided.

DETAILED DESCRIPTION

The present invention relates generally to MEMS devices and specifically to a method and system for utilizing a MEMS device in a high voltage environment. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
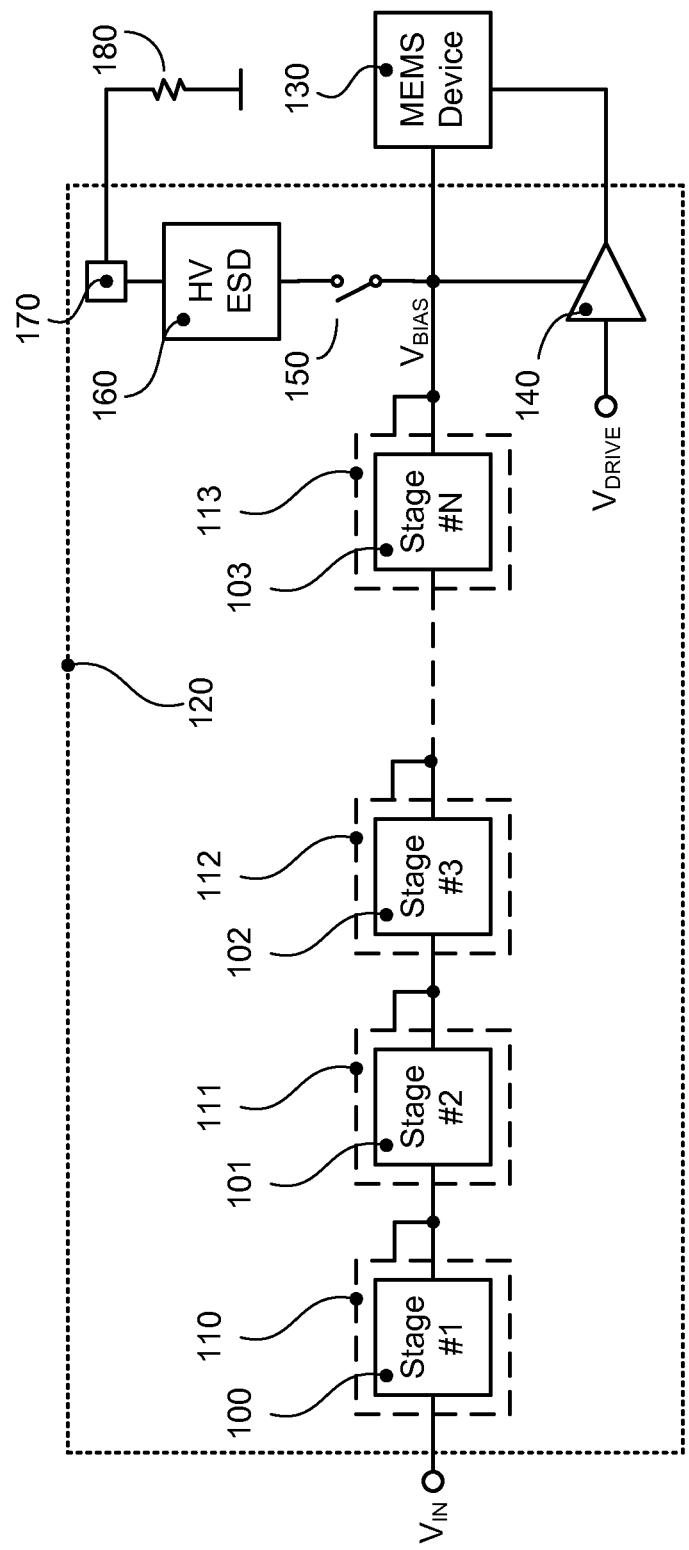
FIG. 1 shows a prior-art implementation of a high-voltage MEMS system.

Some of the complications with using high-voltage biasing can be summarized with reference to FIG. 1, which shows a conventional embodiment of a MEMS system with high-voltage biasing. In this embodiment, a MEMS device 130 connects to a high-voltage bias generator comprising voltage boosting stages 100-103. The first stage 100 accepts an input voltage—for example, the system supply voltage—and provides a boosted voltage at its output. The second stage 101 accepts this boosted voltage as its input, and provides a yet higher boosted voltage at its output. Each of the stages 100-103 of the chain produces successively higher and higher output voltages until the desired bias voltage is achieved and can be applied to the MEMS device.

Supporting high voltages in excess of the supply voltage requires the use of high-voltage isolation around the boosting stages. In the prior-art embodiment of FIG. 1, these isolation regions 110-113 are implemented for each stage 100-103 in the chain. The isolation regions 110-113 reside in a high-voltage substrate technology 120 which provides isolation capability sufficient to support the desired bias voltage.

As there is a premium on the performance gains associated with the use of high-voltage biasing, this type of biasing is typically accomplished with the use of specialized semiconductor process technologies that have been enhanced for the purpose of processing high-voltage signals. Such technologies provide high-voltage isolation capability as well as high-voltage active devices (transistors).

An example of the use of high-voltage transistors may also be seen in the prior-art embodiment of FIG. 1. In this embodiment, the MEMS device 130 receives the high-voltage bias, but it also receives a high-voltage driving signal from a buffer 140. The buffer 140 is powered from the high-voltage bias so that its output swing can be as large as the bias voltage. The use of a large driving voltage allows the buffer 140 to impart more force to the MEMS device 130 for a given electrode area, and thus a high-voltage drive signal allows for better performance and reduced electrode area.

Practical MEMS systems may require testing of the high-voltage bias port of the MEMS device. For example, it may be necessary to stimulate this port for measuring various properties of the MEMS device, such as the gap dimension. For this purpose, the bias port may be connected to an external pad 170 via a high-voltage switch 150. Protecting the bias generator from electrostatic discharge (ESD) requires a high-voltage tolerant ESD protection circuit 160. Finally, any external loading 180 will draw current from the bias generator. In some applications, this additional current draw forces the bias generator design to be overdesigned for drive current capability compared to what would otherwise be required just to bias the MEMS device 130.

Figure 2:
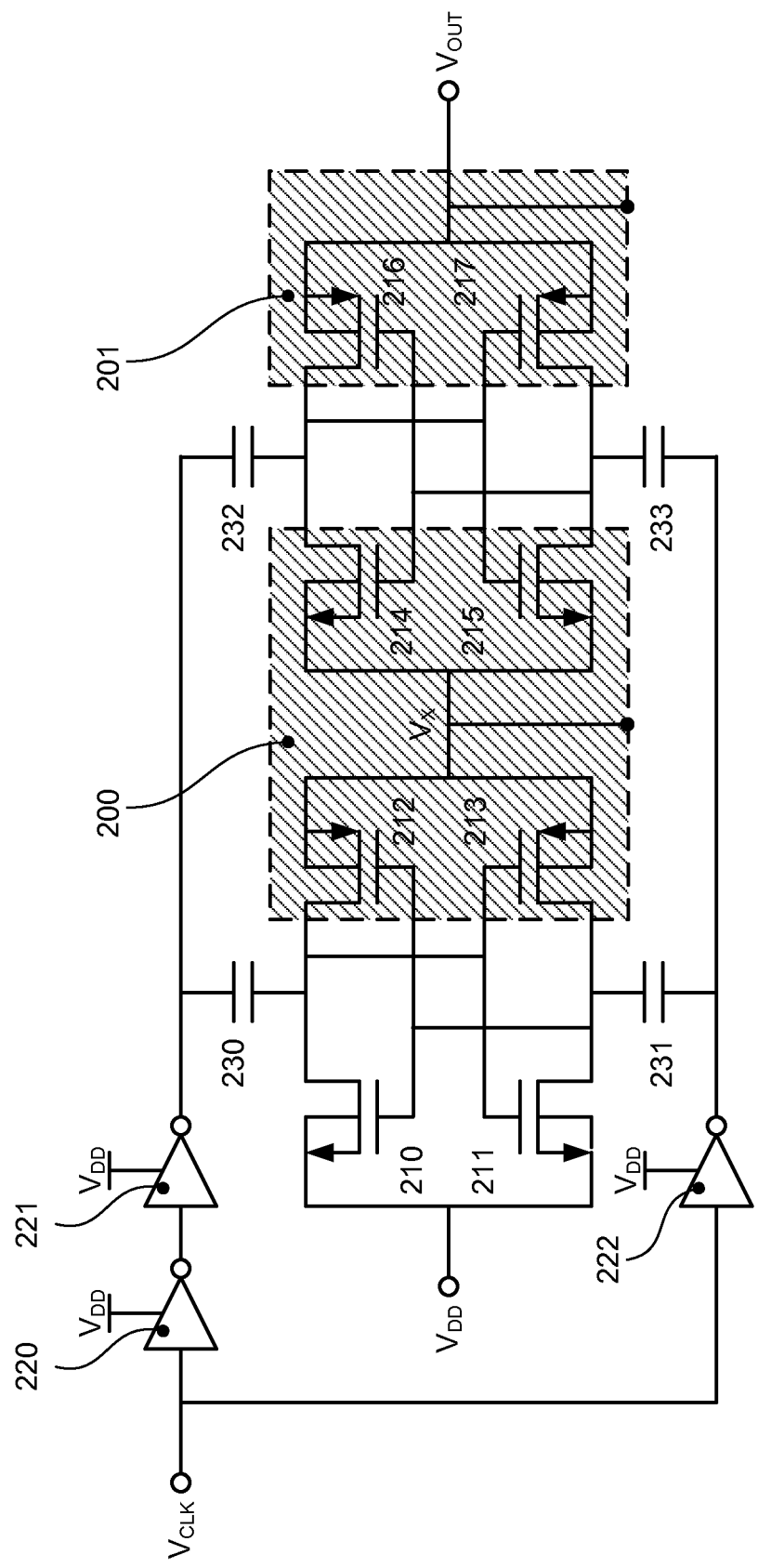
FIG. 2 shows a prior-art implementation of a voltage boosting stage that does not require high-voltage transistors.

FIG. 2 shows a prior-art technique that allows for a voltage boost stage to be implemented without requiring high-voltage transistors. In this technique, transistors 210-213 form a first boosting stage and transistors 214-217 form a second boosting stage. Clock drivers 220-222 coupled to pumping capacitors 230-233 perform the voltage boosting. The principle of operation is as follows. When $V_{CLK}$ is LOW, capacitor 230 holds a voltage approximately equal to $V_{DD}$. When $V_{CLK}$ transitions HIGH, the gate of NMOS 211 rises above the source to a voltage of approximately $2*V_{DD}$, thereby turning on the NMOS 211 and transferring charge onto capacitor 231. At this time, the driven terminal of capacitor 231 is LOW, so that this capacitor 231 charges up to a $V_{DD}$ potential. During the same interval, since the top plate of capacitor 231 is at $V_{DD}$ potential and the top plate of capacitor 230 is at $2*V_{DD}$ potential, the PMOS device 212 turns on and charge transfers from capacitor 230 to the node $V_X$. When $V_{CLK}$ transitions LOW again, the roles of capacitors 230 and 231 are interchanged, with NMOS 210 turning on to refresh the charge on capacitor 230, and PMOS 213 turning on to transfer charge from capacitor 231 to note $V_X$. This process repeats as $V_{CLK}$ continues to toggle so that node $V_X$ charges to a potential of $2*V_{DD}$.

The second stage comprises transistors 214-217 and pumping capacitors 232-233. By similar reasoning, the input voltage, $V_X$, which is nominally at a potential of $2*V_{DD}$, will be boosted by another $V_{DD}$ increment to the output node, $V_{OUT}$. Accordingly, each subsequent stage is capable of boosting the voltage by another increment of $V_{DD}$. The amount of voltage boost per stage is determined by the voltage swing at the output of the clock drivers 221-222. In the foregoing description, it is implicitly assumed that there is no load current applied to node $V_{OUT}$. When load current is present, some of the boosting capacitor charge is dissipated as load current, thereby reducing the amount of voltage boost per stage.

A useful feature of this prior-art technique is that each transistor only experiences a worst-case voltage of $V_{DD}$ across any pair of terminals, provided however that bias nodes ($V_X$ and $V_{OUT}$) are connected to high-voltage isolation regions 200-201 to protect the bulk terminals of transistors 212-215 and 216-217. Without these high-voltage isolation regions 200-201, the gate-to-bulk, source-to-bulk and drain-to-bulk voltages would see the full voltage present at nodes $V_X$ or $V_{OUT}$. In a high-voltage application, where an output voltage exceeding the voltage rating of the transistors is to be produced, the high-voltage isolation regions 200-201 are required to prevent damage to the transistors and these regions must, themselves, stand off the full output voltage relative to the substrate in which the isolation regions sit.

Figure 3:
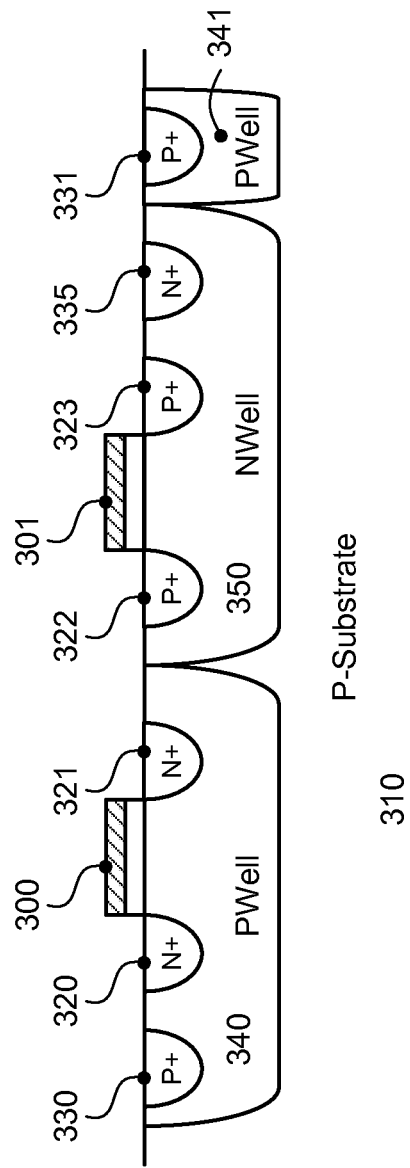
FIG. 3 shows a prior-art low-voltage technology in which an NMOS device lacks isolation to the substrate.

To illustrate how isolation regions are conventionally formed, please make reference to FIG. 3, which shows a cross-section of a prior art CMOS technology. This exemplary technology provides an NMOS device comprising gate electrode 300 and source/drain electrodes 320-321 residing in a PWell 340. The PWells 340 and 341 used in this technology are contacted by P+ implants 330-331. Similarly, the technology provides a PMOS device comprising gate electrode 301 and source/drain electrodes 322-323 residing in a NWell 350. The NWell 350 is contacted by a N+ implant 335. In this technology, the PMOS device is isolated from the P-Substrate 310 by the junction isolation provided at the interface between the NWell 350 and the substrate 310. However, the NMOS device is not isolated, as the PWell 340 makes electrical contact to the P-Substrate 310, which is of the same doping type. Since voltage boosting circuitry will require both isolated NMOS and PMOS devices, this prior-art CMOS technology is not suitable for high-voltage applications.

Figure 4:
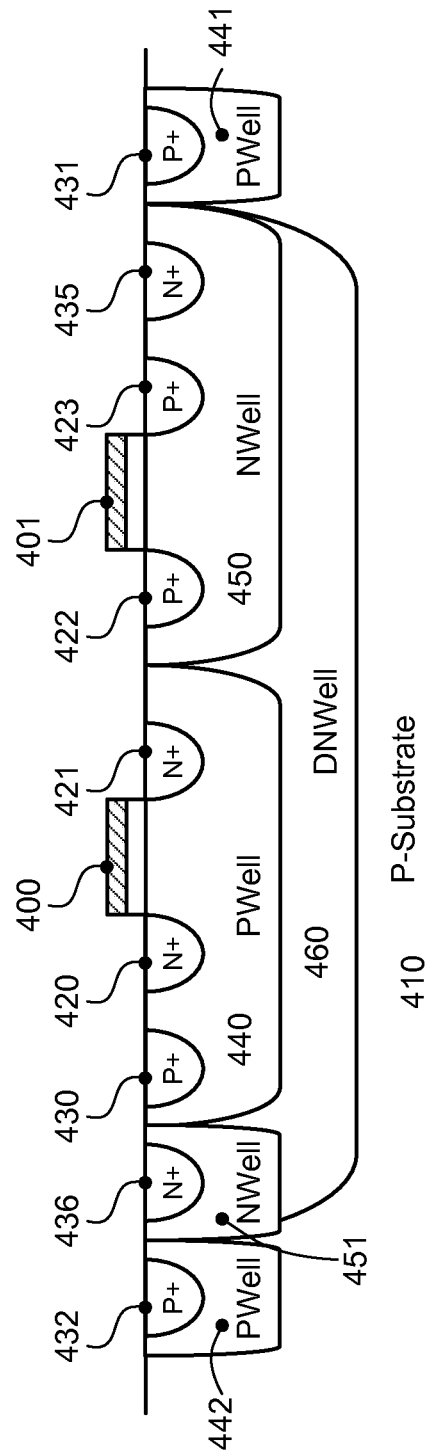
FIG. 4 shows a prior-art low-voltage technology in which a DNW layer provides isolation for the NMOS device.

An improvement to this CMOS technology which provides for an isolated NMOS device is shown in FIG. 4. This exemplary technology provides an NMOS device comprising gate electrode 400 and source/drain electrodes 420-421 residing in a PWell 440. The PWells used in this technology are contacted by P+ implants 430-432. Similarly, the technology provides a PMOS device comprising gate electrode 401 and source/drain electrodes 422-423 residing in a NWell 450. The NWells 450 and 451 used in this technology are contacted by N+ implants 435-436, respectively. To provide NMOS isolation, an additional DNWell 460 is introduced to form a junction barrier between the PWell 440 and P-Substrate 410. This DNWell is contacted by the NWells 450 and 451. The NWells 450 and 451 also provide NMOS isolation by creating a junction barrier between PWell 440 and PWells 441-442. By this combined use of DNWell and NWell implants, the PMOS and NMOS devices are both isolated from the P-Substrate 410. This prior-art CMOS technology can be used for high-voltage applications, provided that the DNWell 460 to P-Substrate 410 junction and the NWell 450-451 to PWell 441-442 junctions can support the high-voltage requirement.

A common requirement for MEMS systems is that there is a need to support a mixture of low-voltage and high-voltage circuits. Transistors optimized for low-voltage operation benefit from improved speed, lower noise and higher density. Similarly, isolation regions supporting lower breakdown voltages can be packed more densely. Typically, a MEMS system may comprise significantly more low-voltage circuits than high-voltage. Therefore, it is advantageous to have a mixture of low-voltage-optimized and high-voltage-optimized devices, circuits and isolation regions. Such a combination allows for the system to have the density of a low-voltage technology combined with the ability to form high-voltage operating subsystems as needed for MEMS support. For example, were this to be accomplished using the prior-art technology of FIG. 4, then there would be two types of DNWell regions: a low-voltage type, and a high-voltage type. Similarly, the NWell and PWell regions will be provided in two types: low-voltage and high-voltage. Unfortunately, the additional flexibility requires additional mask operations during fabrication, which increases cost beyond what a strictly low-voltage technology would have. On the other hand, implementing all of the MEMS system circuitry with only high-voltage tolerant devices would reduce the number of mask operations, but the cost would still be unacceptably high since all of the circuits—even those which do not process high voltages—would be implemented with the larger and less densely packed high-voltage devices.

Figure 5:
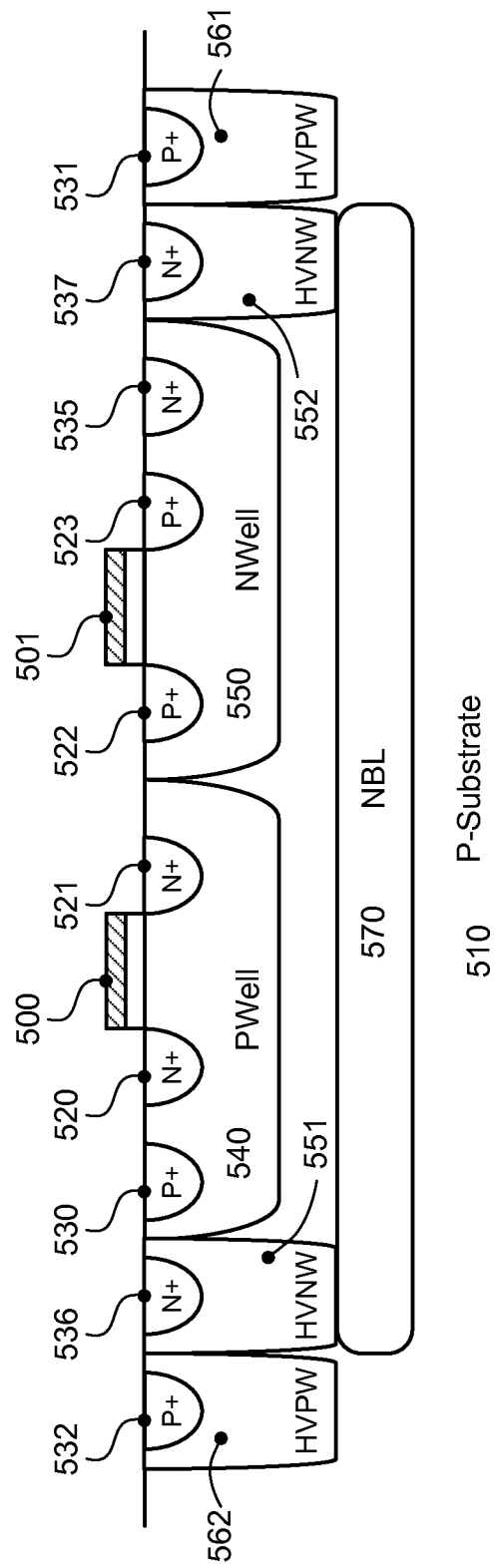
FIG. 5 shows a prior-art high-voltage technology in which an NBL layer provides isolation for the NMOS device.

An alternative prior-art improvement to the CMOS technology of FIG. 3 which provides for an isolated NMOS device is shown in FIG. 5. This technology provides an NMOS device comprising gate electrode 500 and source/drain electrodes 520-521 residing in a PWell 540. The PWell 540 used in this technology is contacted by P+ implants 530. Similarly, the technology provides a PMOS device comprising gate electrode 501 and source/drain electrodes 522-523 residing in a NWell 550. The NWell 550 used in this technology are contacted by N+ implants 535. To provide NMOS isolation, an additional N-type buried layer (NBL) 570 is introduced to form a junction barrier between PWell 540 and P-Substrate 510. The NBL 570 is contacted by special high-voltage NWells (HVNW) 551-552. The HVNWs 551-552 also provide NMOS isolation by creating a junction barrier between PWell 540 and adjacent high-voltage PWells (HVPW) 561-562. By this combined use of NBL 520, HVNW 551-552 and HVPW 561-562 implants, the PMOS and NMOS devices are both isolated from the P-Substrate 510. This prior-art CMOS technology can be used for high-voltage applications, provided that the NBL 570 to P-Substrate 510 junction and the HVNW 551-552 to HVPW 561-562 junctions can support the high-voltage requirement. Similar to the prior-art CMOS technology of FIG. 4, this prior-art technology introduces additional wells (HVNW, HVPW and NBL) to provide for high-voltage isolation capability but at increased cost compared to strictly low-voltage technologies.

To provide for high-voltage operation while retaining the density and performance advantages of a low-voltage technology, one has to make use of specialized semiconductor process technologies which make high-voltage isolation and transistors available. However, these technologies require additional masking layers to implement these high-voltage features. The additional cost is undesirable. The alternative is to restrict the bias voltage to a level where low-voltage semiconductor process technologies may be used, but doing so may also result in an increase in cost due to growth of the MEMS device area required to maintain performance at lower voltages. In some cases, operating at low-voltage further becomes impractical due to a lack of capacitive sensitivity that cannot be compensated by an increase in MEMS device area.

In low-voltage CMOS technologies incorporating DNWell isolation—such as the prior-art technology illustrated in FIG. 4—the breakdown voltage from the DNWell/NWell isolation region is typically limited by the NWell to PWell breakdown voltage, which occurs along the vertical junction between NWell and PWell regions where these regions abut. An example of such a junction is found in FIG. 4 at the boundary between NWell 451 and PWell 442. The doping of the NWell 451 generally exceeds that of the more lightly-doped DNWell 460. Similarly, the doping of the PWell 442 generally exceeds that of the more lightly-doped P-Substrate 410. When these more highly-doped wells are adjacent to each other, the resulting vertical junction will have a breakdown voltage that is lower than that of the horizontal junction formed at the boundary between their more lightly-doped counterparts—the DNWell and P-Substrate. It is usually desirable that regions of the substrate not implanted by NWell should be implanted by PWell. Doing so will prevent unwanted surface regions possessing the native P-substrate doping level, which can pose a hazard for the flow surface leakage currents. These currents form when the native P-substrate doping is low enough that the semiconductor surface can easily become inverted by voltages present in overlying conductors. Because it is usually desirable for NWell and PWell coverage to be complementary, some CMOS technologies derive the PWell implant mask by inverting the data for the NWell mask, thereby guaranteeing a complementary relationship.

There is, however, a situation where native substrate doping at the surface is desirable, and that is the case of a native NMOS device. Such a device has a lower threshold voltage than a standard NMOS device on account of the lower doping that occurs when the PWell implant is blocked under the NMOS device. This lower threshold can be useful for some applications, as will be familiar to one of ordinary skill in the art.

Native substrate regions can be defined in various ways. For example, a given CMOS technology may provide for the NWell and PWell implant masks to be individually determined by unique mask layers, so that a native region can be defined by omitting both NWell and PWell in a particular region of substrate. Alternatively, the PWell implant mask may be derived by inverting the NWell mask data so that PWell regions are formed everywhere that NWell is not implanted. When this technique is used, a native region may be defined by employing a Native mask layer that causes PWell implants to be blocked wherever native mask data is present and NWell mask data is absent. Either of these techniques is suitable for defining regions of the substrate with native doping near the surface. Conventionally, these techniques may be applied to the formation of native NMOS devices which are a common feature of prior-art CMOS technologies.

Figure 6:
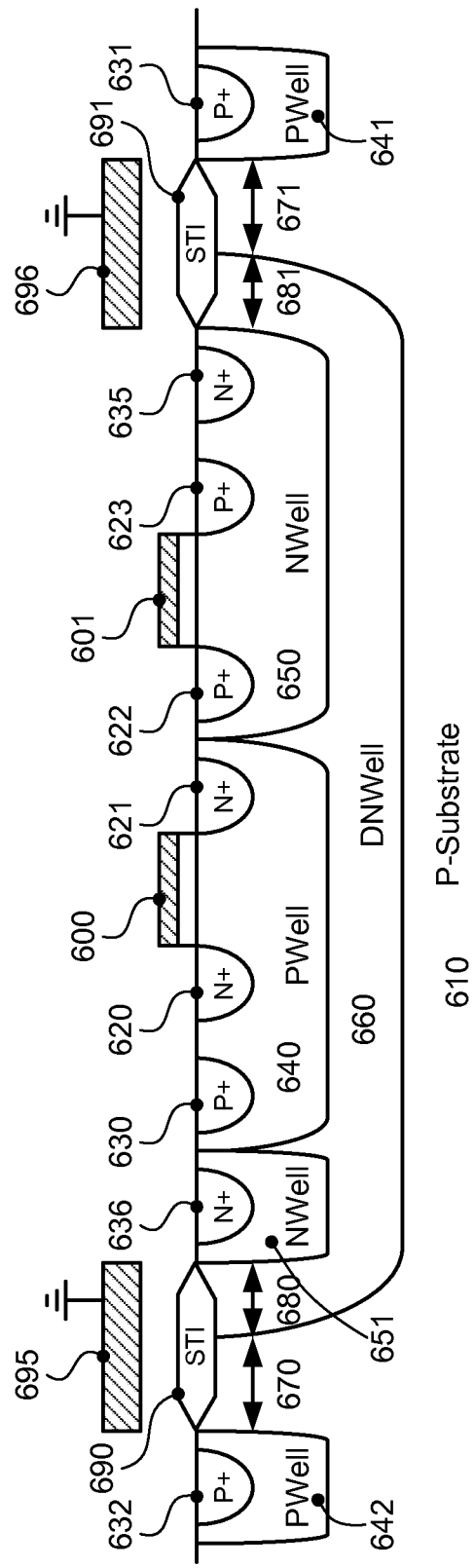
FIG. 6 shows a cross-section of an embodiment of the present invention using a high-voltage isolation compatible with a low-voltage technology.

FIG. 6 shows an embodiment of the present invention in which the breakdown voltage of a low-voltage semiconductor technology NWell/DNWell isolation region may be extended to support high voltages by blocking of the PWell implants in certain substrate regions. The embodiment of FIG. 6 employs a base semiconductor technology similar to the prior-art technology illustrated in FIG. 4. This technology provides an NMOS device comprising gate electrode 600 and source/drain electrodes 620-621 residing in a PWell 640. The PWells 640 used in this technology are contacted by P+ implants 630-632. Similarly, the technology provides a PMOS device comprising gate electrode 601 and source/drain electrodes 622-623 residing in a NWell 650. The NWells used in this technology are contacted by N+ implants 635-636. To provide NMOS isolation, an additional DNWell 660 is introduced to form a horizontal junction barrier between PWell 640 and P-Substrate 610. This DNWell is contacted by NWells 650-651. The NWells 650-651 also provide NMOS isolation by creating a vertical junction barrier between PWell 640 and the P-Substrate 610. By this combined use of DNWell and NWell implants, the PMOS and NMOS devices are both isolated from the P-Substrate 610.

To extend the breakdown voltage of the NWell/DNWell isolation region, a native region 670-671 is formed separating the PWells 641-642 from the neighboring DNWell 660. In some embodiments, a second native region comprising a DNWell region 680-681 which lacks both NWell and PWell implants lies adjacent to the native region 670-671. Note that the terminology "native region" is employed for convenience to refer to a region of the substrate where a well implant is omitted to achieve a reduced doping level (the native doping level). For example, in FIG. 6, the native doping level may refer to that doping level associated with either the native P-substrate when the PWell implant is omitted, or the native DNWell when the NWell implant is omitted. By virtue of the lighter doping of the native region 670-671 and/or adjacent native DNWell region 680-681, the vertical junction at the boundary between these regions will have a much higher breakdown voltage. This higher breakdown voltage allows higher bias voltages to be supported across the DNWell to P-Substrate junction, thereby forming an extended-voltage isolation region.

It should be noted that other embodiments are also possible. For example, the native DNWell regions 680-681 might be omitted so that the NWell 650-651 come in direct contact with the native substrate region 670-671. In this case, only one side of the resulting vertical junction is lightly doped. Such asymmetrically doped junctions also benefit from higher breakdown voltages, as the depletion region formed when the junction is reverse biased extends farther into the lightly-doped side of the junction, thereby reducing the electric field and raising the breakdown voltage. Similarly, one could omit the native substrate region 670-671 and use only the native DNWell region 680-681. In this case, an asymmetric junction is formed with the DNWell side of the junction being more lightly-doped. With any of these approaches, the key feature is the introduction of a lightly-doped region on at least one-side of the junction to spread the electric field under reverse bias conditions so that the breakdown voltage may be significantly extended.

A benefit of this technique is that native substrate regions and native DNWell regions may readily be formed in most standard, low-voltage CMOS technologies by employing mask layers already defined for the purpose of forming native NMOS devices by blocking the PWell implant. By this approach, an extended-voltage isolation region capable of supporting high voltages beyond the normal rating of the process may be implemented without incurring additional mask cost.

As previously mentioned, one concern with native substrate regions is the potential for surface leakage currents to flow if the surface becomes inverted. An improved embodiment of the present invention makes use of additional features available in standard, low-voltage CMOS technologies to guard against surface leakage current formation.

For example, in FIG. 6, P+ regions 631-632 and PWells 641-642 form a guard ring around the native substrate regions 670-671. This guard ring terminates the electric field and acts as a barrier between the native region and any N-type regions lying beyond the guard ring. N-type regions are a hazard because they are a potential source of electrons that can provide a path for surface currents to flow in the native regions. The use of P-type guard rings helps to prevent such currents.

Additionally, a shallow-trench isolation (STI) 690-691 at the semiconductor surface over the native substrate 670-671 and native DNWell 680-681 regions may be used to provide a buffer zone to further spread the electric field deeper into the substrate. A metal ground shield 695-696 above the isolation region may be used to prevent stray electric fields from signal or bias lines routed over the isolation region from terminating on the substrate and possibly inverting the surface, thereby promoting leakage currents. The use of metal shields is particularly useful for shielding the high-voltage output of any bias generator that may be used to provide a MEMS bias voltage.

Figure 7:
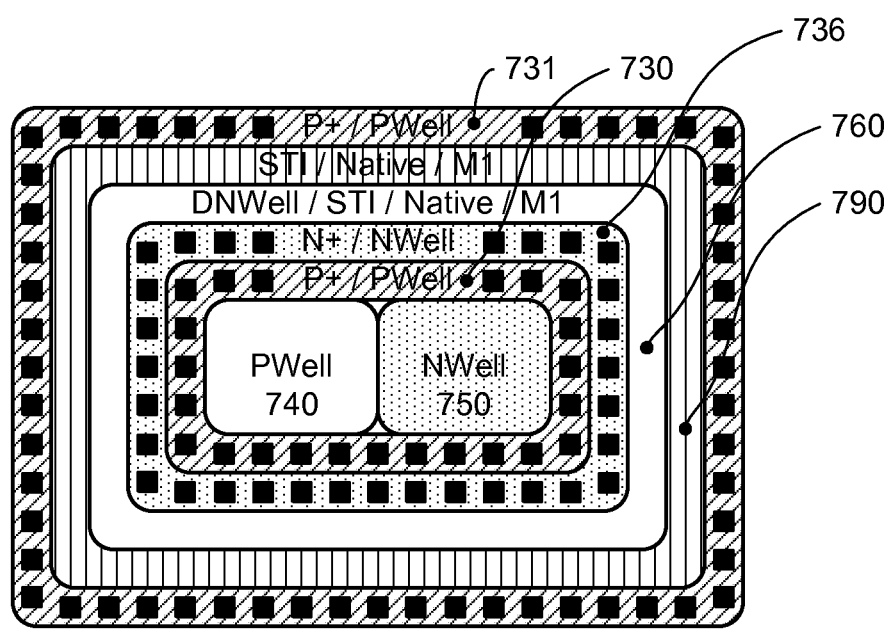
FIG. 7 shows a plan view of an embodiment of the present invention using a high-voltage isolation compatible with a low-voltage technology.

FIG. 7 shows a plan view of an embodiment of the present invention in accordance with the cross-section shown in FIG. 6. The plan view of FIG. 7 omits the NMOS and PMOS device geometries for clarity, but it will be obvious to one of ordinary skill that the PWell 740 and NWell 750 regions in FIG. 7 might contain NMOS and PMOS devices, respectively. FIG. 7 illustrates how an isolation region with extended breakdown voltage might be formed using concentric guard rings of different implant types. The inner-most ring 730 uses P+/PWell to establish the potential of the inner PWell region 740, which is also the bulk terminal of an NMOS device implemented in that region. The next ring 736 is an N+/NWell guard ring that isolates the inner PWell 740 from the outer substrate and provides a bias contact to the underlying DNWell.

Outside the N+/NWell guard ring 736 is a region 760 comprising DNWell/STI/Native covered by a metal ground shield (in this case, M1). A native drawing layer is used over region 760 to define a region where neither PWell nor NWell implants are permitted, thereby defining a native DNWell region. Although region 760 encircles the N+/NWell region 736, it is understood with reference to FIG. 6 that the DNW, itself, actually extends beneath the regions 730, 736, 740 and 750 to provide isolation to the outer substrate. Outside region 760 is a region 790 comprising STI/Native and also covered by a metal ground shield (in this case, M1). Note that the M1 covering regions 760 and 790 may be common, as they share the same ground potential. A native drawing layer is used over region 790 to define a region of native substrate doping. Finally, an outer-most P+/PWell guard ring 731 encloses the native substrate region 790.

As previously discussed with reference to FIG. 6, other embodiments are also possible. For example, it would be possible to use only one of the two native regions 760 and 790. Provided that at least one of the two regions is present, the electric field associated with high-voltage bias will be spread over the junction depletion region extending into the native region so that the breakdown voltage of the isolation may be extended.

This type of extended-voltage isolation structure can be used to isolate NMOS and PMOS devices residing in the interior PWell 740 and NWell 750 regions. An example of the application of this embodiment would be to combine it with the voltage boosting stage of FIG. 2. In such an application, the embodiment of FIGS. 6 and 7 would provide the necessary isolation region 200 in which the NMOS and PMOS bulk terminals are tied to node $V_X$, which also biases the isolation region. With specific reference to FIGS. 2 and 7, the NMOS devices 214-215 would reside within the interior PWell 740 and the PMOS devices 212-213 would reside within the interior NWell 750, and the node $V_X$ of FIG. 2 would correspond to the connection of these two wells to each other and to the guard rings 730 and 736.

Figure 8:
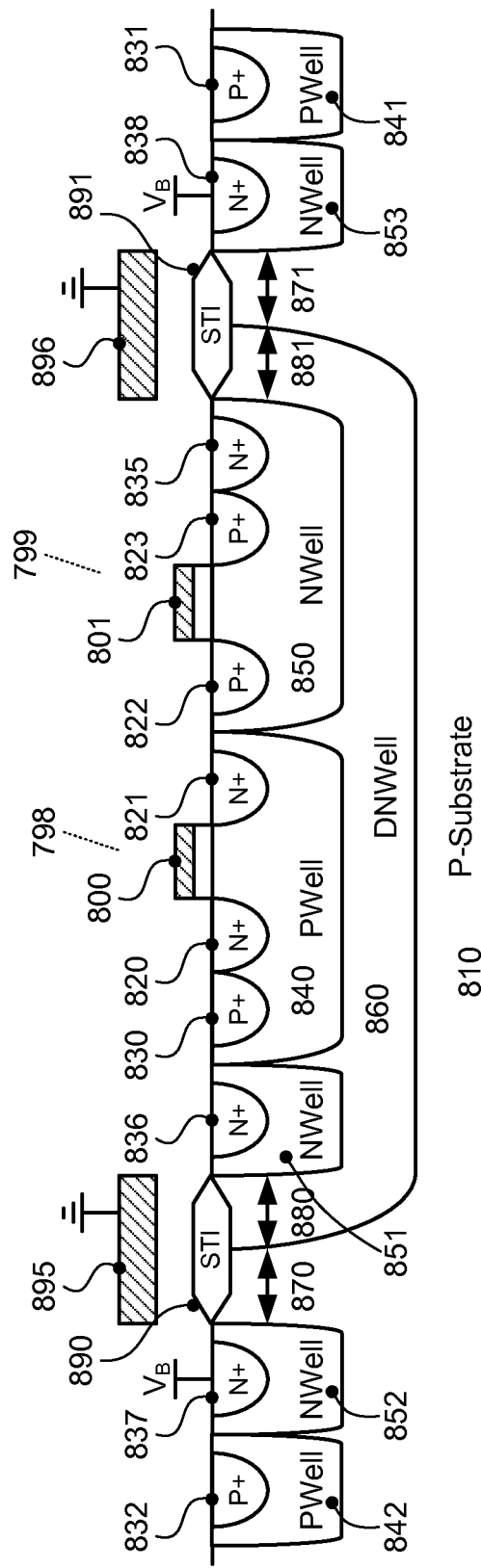
FIG. 8 shows a cross-section of another embodiment of the present invention using a high-voltage isolation compatible with a low-voltage technology.

An alternative embodiment of the present invention is shown in FIG. 8. This embodiment bears substantial similarity to the embodiment of FIG. 6, and corresponding features between these two figures have been labeled with corresponding numerical references. The embodiment of FIG. 8 introduces an NWell 852-853 with N+ contact 837-838 between the native substrate region 870-871 and the outer PWell 841-842 with P+ contact 831-832. This embodiment employs a slightly different strategy for preventing the flow of surface leakage currents by biasing the NWell 852-853 at an elevated potential ($V_B$).

When the potential ($V_B$) is elevated sufficiently above the ground potential of the overlying metal shield 895-896, inversion of the surface charge at the boundary between the native substrate region 870-871 and the NWell 852-583 may be prevented. As in the embodiment of FIG. 6, an extended-voltage isolation may be formed by virtue of the lighter doping of native regions 870-871 and/or 880-881. As before, these lightly-doped regions may be used individually or in combination to achieve higher breakdown voltages. The STI regions 890-891 and metal shields 895-896 serve the same functions as in the embodiment of FIG. 6.

Figure 9:
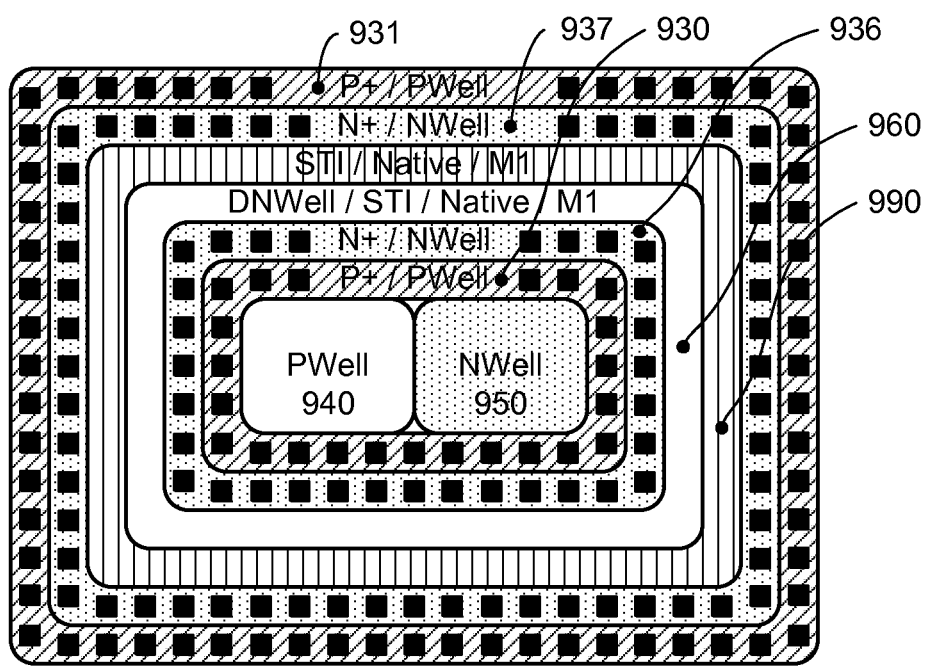
FIG. 9 shows a plan view of another embodiment of the present invention using a high-voltage isolation compatible with a low-voltage technology.

FIG. 9 provides a plan view of the embodiment of FIG. 8. This embodiment bears similarity to the embodiment of FIG. 7, and corresponding features between these two figures have been labeled with corresponding numerical references. The embodiment of FIG. 9 introduces an N+/NWell guard ring 937 in-between the native substrate region 990 and the outer P+/PWell guard ring 931. As in the case of FIG. 7, the NMOS and PMOS devices that may reside within the interior PWell 940 and NWell 950 regions have been omitted for clarity. Also as in the case of the embodiment of FIG. 7, the embodiment of FIG. 9 may be used to form an extended-voltage isolation region which can be the basis of generating high bias voltages required for MEMS devices.

For example, the prior-art technique of FIG. 2 could alternatively be combined with the embodiment of FIG. 9 in a manner similar to that of the embodiment of FIG. 7. A difference for the embodiment of FIG. 9 is the need to supply a bias voltage to the N+/NWell guard ring 937 for the purpose of preventing surface leakage currents from flowing across the native substrate region 990. It should be clear that the corresponding parts of the FIG. 9 and FIG. 7 embodiments are used in corresponding fashion when combined with the prior-art technique of FIG. 2.

Although uses of these embodiments of the present invention have been described with reference to a specific prior-art technique, this should not be taken to limit the scope of the present invention. In general, any circuit requiring a high-voltage isolation may benefit by the application of this invention. The present invention is of particular use to enable the processing of voltages beyond the normal breakdown limits of conventional CMOS or BiCMOS technologies without incurring the additional mask expense associated with explicit high-voltage support features.

The extended voltage isolation technique of the present invention may be applied advantageously to the realization of a high-voltage MEMS system in a low-voltage semiconductor technology. An embodiment of the present invention illustrating that usage is found in FIG. 10. In this figure, a high-voltage bias generator comprising a sequence of voltage boosting stages 1000-1003 supplies a bias voltage, $V_{BIAS}$, to a MEMS device 1030. The bias generator accepts an input voltage that is within the voltage rating of the semiconductor process. This voltage is sequentially boosted to higher and higher voltages by each voltage boosting stage 1000-1003 in the chain of stages, finally producing a high voltage bias output, $V_{BIAS}$. Each stage 1000-1003 produces an intermediate output voltage that is then provided to the next stage. These intermediate voltages are used to bias extended-voltage isolation regions 1010-1013 that isolate the devices in each stage 1000-1003 that are processing high voltages. In this embodiment, the extended-voltage isolation regions may be implemented in accord with one or more of the embodiments described with reference to FIGS. 6-9. The extended-voltage isolation regions 1010-1013 reside in the low-voltage semiconductor substrate 1020.

By virtue of the use of the extended voltage isolation regions, one may enable the generation of a high voltage bias output in excess of the normal voltage rating of the low-voltage semiconductor substrate. For example, a conventional low-voltage CMOS process may be a 1.8V mixed-signal process which provides for CMOS devices with 1.8V and/or 3.3V nominal voltage ratings. Such a process might provide an inherent voltage isolation up to 15V. By applying the extended voltage isolation regions in accordance with the present invention, one may enable the production of extended voltages beyond 15V. For example, one may be able to support 25V, 40V or even 100V, depending upon the particular process technology. Of course, it should be understood that various low-voltage process technologies may provide various inherent voltage isolation capabilities. In general, it may be possible to extend the inherent capability of any low-voltage process to higher voltages in accordance with the present invention.

Figure 10:
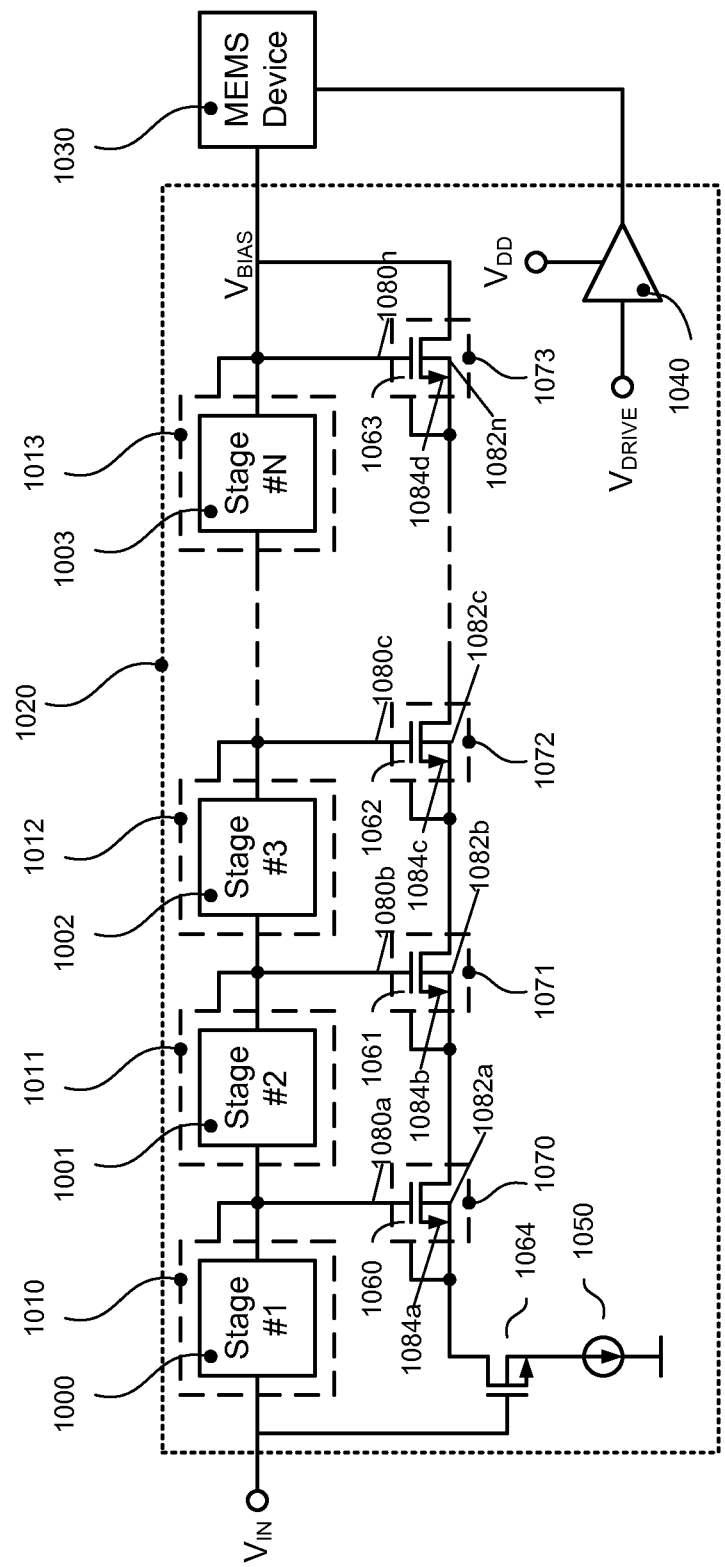
FIG. 10 shows an embodiment of the present invention incorporating the use of high-voltage isolation in a low-voltage technology substrate without requiring high-voltage transistors.

Comparing the embodiment of FIG. 10 to the prior-art implementation of FIG. 1, it can be seen that additional measures are needed to eliminate any dependency on high-voltage transistors. For example, the prior-art implementation of FIG. 1 requires high-voltage switches 150, and high-voltage ESD 160 to provide external testability for the high-voltage bias port of the MEMS device 130. The drive amplifier for the MEMS 140 also makes use of high-voltage transistors to provide a high-voltage swing to the MEMS drive electrodes. To eliminate any requirement for high-voltage transistors, the embodiment of FIG. 10 employs a low-voltage driver 1040 that uses only transistors available in the low-voltage semiconductor technology.

A self-test capability employing current bias generator 1050 and current buffer devices 1060-1063 improves the testability of the high-voltage output by providing a current sink. A current sink is advantageous because it improves the negative slew rate of the high-voltage bias generator. For example, high-voltage bias generators based on charge-pump techniques (such as the exemplary prior-art implementation of FIG. 2) are efficient at sourcing current to the high-voltage output, but may not provide ability to sink current. When testing the high-voltage output, it may be desirable to modulate the voltage up and down, thereby requiring the bias generator to source and sink current in an alternating fashion. Such modulation can be used to test the functionality of the bias generator, or to test the response of the MEMS device to modulation of the high-voltage output. For example, the high-voltage output may be indirectly measured with a resistive divider without requiring high-voltage process features. Alternatively, the response of the high-voltage output may be inferred by measurements of the MEMS device response. Without a current sink connected to the high-voltage output, the negative-going slew rate of the high-voltage output might be limited. Therefore, it is advantageous provide a current sink capability compatible with a high output voltage without requiring high-voltage process features.

The operation of a self-test capability in accordance with the present invention is described as follows. Referring again to FIG. 10, a self-test capability is provided using a current bias generator 1050 coupled to a chain of current buffer devices 1060-1063 that provides a path for current to flow from the high-voltage output, $V_{BIAS}$, to be sunk by the current bias generator. Each current buffer device 1060-1063 has a gate terminal 1080*a*-1080*n* coupled to the output of a stage in the high-voltage bias generator chain. The current buffer devices are connected in series so that current flows from $V_{BIAS}$ down through a series of stages with sequentially lower operating voltages. In this manner, each current buffer device supports only a fraction of the full bias voltage and operates well within its voltage rating. To eliminate high voltages to the bulk terminal 1082a-1082n of the devices 1060-1063, each current buffer device bulk terminal 1082a-1082n is tied to a source terminal 1084a-1084n, and both of these terminals are tied to extended-voltage isolation regions 1070-1073. By this method, the isolation regions alone have to support high voltage. The isolation regions supporting the largest voltages are those 1013, 1073 at the end of the chains and nearest to the $V_{BIAS}$ node.

In some embodiments, the input voltage to the bias generator, $V_{IN}$, may itself be as high as the voltage rating for the transistors. In this case, the output of the first voltage boosting stage 1000 will already be greater than the voltage rating for the transistors. To prevent any overstress on the current bias generator 1050, an additional current buffer device 1064 is required. In one embodiment, the gate of this device is tied to $V_{IN}$, thereby guaranteeing that the voltage supported by the current bias generator is strictly less than $V_{IN}$. Device 1064 does not require an extended-voltage isolation region, as its bulk potential is less than $V_{IN}$.

Note that the aforementioned low-voltage driver and the self-test capability may be used individually, or in combination.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A MEMS system comprising:
   a MEMS device comprising a high-voltage port; and
   a CMOS device comprising: a semiconductor technology substrate, an extended-voltage isolation region, and a high-voltage bias generator,
wherein, the extended-voltage isolation region comprises a native region separating an N-type well region from a P-type well region, thereby extending a breakdown voltage between the N-type and P-type well regions,
   wherein, the high-voltage bias generator is coupled to the extended-voltage isolation region, the extended-voltage isolation region resides in the semiconductor substrate such that one of the N-type and P-type well regions is in contact with the semiconductor substrate, and the high-voltage bias generator is further coupled to the high-voltage port.

2. The system of claim 1, wherein the MEMS device further comprises a low-voltage drive port, the CMOS device further comprises a low-voltage driver circuit, the low-voltage driver circuit is coupled to the low-voltage drive port.

3. The system of claim 1, wherein the high-voltage bias generator further comprises a charge pump, the charge pump comprises a plurality of stages, at least one of the plurality of stages providing an output operable at high-voltage.

4. The system of claim 1, wherein the extended-voltage isolation region further comprises:
   an N-type well region;
   a P-type well region in contact with a substrate region; and
   a native region,
   wherein the native region separates the N-type well region from the substrate region, and the separation is effective to extend a breakdown voltage between the N-type well region and the substrate region.

5. The system of claim 1, wherein the CMOS device further comprises:
   a current bias generator;
   a current buffer device; and
   a second extended voltage isolation, wherein the current buffer device resides in the second extended voltage isolation region, the second extended voltage isolation region coupled to the high-voltage bias generator, the current buffer device is coupled to the current bias generator and the high-voltage port, the current buffer device is operable to convey a flow of current between the high-voltage port and the current bias generator.

6. The system of claim 1, wherein the CMOS device further comprises a low-voltage buffer, the MEMS device further comprises a low-voltage port, and the low-voltage buffer coupled to the low-voltage port.

7. The system of claim 1, wherein:
   the semiconductor technology substrate provides inherent voltage isolation less than 15V,
   and the high-voltage bias generator produces a voltage greater than 15V.

8. The system of claim 1, wherein:
   the semiconductor technology substrate is fabricated using a 1.8V mixed-signal process,
   and the high-voltage bias generator produces a voltage greater than 15V.

9. The system of claim 5, wherein the current buffer device further comprises:
   a gate terminal, a source terminal, a bulk terminal, wherein the source terminal is coupled to the current generator, the gate terminal is coupled to the high-voltage bias generator, the bulk terminal is coupled to the second extended-voltage isolation region, and the source terminal.

10. The system of claim 9, wherein the CMOS device further comprises a low-voltage buffer; the MEMS device further comprises a low-voltage port; and the low-voltage buffer coupled to the low-voltage port.

11. A method of operating a MEMS system comprising the steps of:
   producing a high-voltage bias; and
   isolating the high-voltage bias using an extended-voltage isolation region, the extended-voltage isolation region residing in a semiconductor substrate, applying the high-voltage bias to a MEMS device,
   wherein, the extended-voltage isolation region comprises a native region separating an N-type well region from a P-type well region, thereby extending a breakdown voltage between the N-type and P-type well regions.

12. The method of claim 11, further comprising the step of:
   driving the MEMS device with a low-voltage drive signal.

13. The method of claim 11, further comprising the step of:
   applying a test current to the high-voltage bias of the MEMS device.

14. The method of claim 12, further comprising the step of:
   applying a test current to the high-voltage bias of the MEMS device.

15. An extended voltage isolation region comprising:
   a N-type well region;
   a P-type well region;
   a substrate region of the same type as one of the N-type or P-type well regions, wherein one of the N-type or P-type well regions is in contact with the substrate region; and
   a native region, wherein the native region separates the N-type well region from the P-type well region, and the separation is effective to extend a breakdown voltage between the N-type well region and the P-type well region.

16. The extended voltage isolation region of claim 15, wherein the native region is doped P-type.

17. The extended voltage isolation region of claim 15, wherein the native region is doped N-type.

18. The extended voltage isolation region of claim 15, further comprising a metal shield substantially covering the native region.

19. The extended voltage isolation region of claim 15, further comprising a shallow-trench isolation region substantially covering the native region.

20. The extended voltage isolation region of claim 15, further comprising a P-type highly doped region, wherein the P-type highly-doped region resides in the P-type substrate region and encircles the native region.

21. The extended voltage isolation region of claim 15, further comprising a guard ring around the native region.

22. The extended voltage isolation region of claim 15, further comprising a lower doping region around the native region.

23. The extended voltage isolation region of claim 20, further comprising a N-type highly doped region; wherein the N-type highly doped region resides in the N-type well region and the native region encircles the N-type highly doped region.

24. The extended voltage isolation region of claim 23, further comprising a second N-type highly doped region, wherein the second N-type highly doped region resides in the P-type substrate region and encircles the native region, and the P-type highly-doped region encircles the second N-type highly doped region.

25. An extended voltage isolation region comprising:
  a N-type well region;
  a P-type well region;
  a substrate region of the same type as one of the N-type or P-type well regions, wherein one of the N-type or P-type well regions is in contact with the substrate region;
  a native region, wherein the native region separates the N-type well region from the P-type well region, and the separation is effective to extend a breakdown voltage between the N-type well region and the P-type well region; and
  a metal shield substantially covering the native region; and
  a shallow-trench isolation region substantially covering the native region; a P-type highly doped region, wherein the P-type highly-doped region resides in the P-type well region and encircles the native region; and a N-type highly doped region, wherein the N-type highly doped region resides in the N-type well region and the native region encircles the N-type highly doped region.

26. The extended voltage isolation region of claim 25, further comprising:
  a second N-type highly doped region, wherein the second N-type highly doped region resides in the P-type substrate region and encircles the native region, and the P-type highly-doped region encircles the second N-type highly doped region.

* * * * *